US007205091B2

(12) United States Patent
Cassidy

(10) Patent No.: US 7,205,091 B2
(45) Date of Patent: Apr. 17, 2007

(54) LITHOGRAPHIC PRINTING WITH PRINTING MEMBERS HAVING PRIMER LAYERS

(75) Inventor: Kenneth R. Cassidy, Goffstown, NH (US)

(73) Assignee: Presstek, Inc., Hudson, NH (US)

(*) Notice: Subject to any disclaimer, the term of this patent is extended or adjusted under 35 U.S.C. 154(b) by 0 days.

(21) Appl. No.: 11/119,421

(22) Filed: Apr. 29, 2005

(65) Prior Publication Data

US 2005/0263022 A1 Dec. 1, 2005

Related U.S. Application Data

(60) Provisional application No. 60/568,344, filed on May 5, 2004.

(51) Int. Cl.
*G03F 7/14* (2006.01)
*G03F 7/11* (2006.01)

(52) U.S. Cl. ............................... 430/272.1; 430/271.1; 430/273.1; 430/302; 430/303; 430/330; 430/964

(58) Field of Classification Search ............ 430/271.1, 430/272.1, 273.1, 302, 303, 330, 964
See application file for complete search history.

(56) References Cited

U.S. PATENT DOCUMENTS

| | | | | |
|---|---|---|---|---|
| 4,577,932 | A | 3/1986 | Gelbart | |
| 5,188,032 | A | 2/1993 | Lewis et al. | |
| 5,212,048 | A | 5/1993 | Lewis et al. | |
| 5,310,869 | A | 5/1994 | Lewis et al. | |
| 5,339,737 | A | 8/1994 | Lewis et al. | |
| 5,385,092 | A | 1/1995 | Lewis et al. | |
| 5,517,359 | A | 5/1996 | Gelbart | |
| RE35,512 | E | 5/1997 | Nowak et al. | |
| 5,802,034 | A | 9/1998 | Gelbart | |
| 5,861,992 | A | 1/1999 | Gelbart | |
| 6,083,664 | A | 7/2000 | Inno et al. | |
| 6,132,934 | A * | 10/2000 | Vermeersch et al. | 430/273.1 |
| 6,354,209 | B1 | 3/2002 | Van Aert Huub et al. | |
| 6,576,399 | B1 * | 6/2003 | Gries et al. | 430/272.1 |
| 2004/0031407 | A1 | 2/2004 | Tsumoru et al. | |

FOREIGN PATENT DOCUMENTS

| | | |
|---|---|---|
| EP | 0 580 394 A | 1/1994 |
| EP | 1 036 654 A | 9/2000 |
| EP | 1 151 858 A | 11/2001 |

OTHER PUBLICATIONS

International Preliminary Report on Patentability for PCT/US2005/015223 dated Nov. 7, 2006.
Written Opinion of the International Searching Authority for PCT/US2005/015223 dated Nov. 7, 2006.

* cited by examiner

*Primary Examiner*—Richard L. Schilling
(74) *Attorney, Agent, or Firm*—Goodwin Procter LLP

(57) ABSTRACT

A primer layer that includes a surface-tension modifier dispersed within a polymer binder is disposed between the imaging layer and the substrate of a lithographic printing member to inhibit the production of thermal degradation products that disrupt the oleophilicity of the exposed imaged areas, thereby improving print-making performance and efficiency. In addition, embodiments of the primer layer inhibit static charge buildup during production and during the print-making process.

48 Claims, 7 Drawing Sheets

LITHOGRAPHIC PRINTING WITH PRINTING MEMBERS HAVING PRIMER LAYERS

CROSS-REFERENCE TO RELATED APPLICATIONS

The present application claims priority to and the benefit of U.S. provisional application Ser. No. 60/568,344, filed on May 5, 2004, the disclosure of which being incorporated by reference herein.

BACKGROUND OF THE INVENTION

In offset lithography, a printable image is present on a printing member as a pattern of ink-accepting (oleophilic) and ink-rejecting (oleophobic) surface areas. Once applied to these areas, ink can be efficiently transferred to a recording medium in the imagewise pattern with substantial fidelity. Dry printing systems utilize printing members whose ink-repellent portions are sufficiently phobic to ink as to permit its direct application. In a wet lithographic system, the non-image areas are hydrophilic, and the necessary ink-repellency is provided by an initial application of a dampening fluid to the plate prior to inking. The dampening fluid prevents ink from adhering to the non-image areas, but does not affect the oleophilic character of the image areas. Ink applied uniformly to the printing member is transferred to the recording medium only in the imagewise pattern. Typically, the printing member first makes contact with a compliant intermediate surface called a blanket cylinder which, in turn, applies the image to the paper or other recording medium. In typical sheet-fed press systems, the recording medium is pinned to an impression cylinder, which brings it into contact with the blanket cylinder.

To circumvent the cumbersome photographic development, plate-mounting, and plate-registration operations that typify traditional printing technologies, practitioners have developed electronic alternatives that store the imagewise pattern in digital form and impress the pattern directly onto the plate. Plate-imaging devices amenable to computer control include various forms of lasers.

Depending on the particular printing member and imaging conditions, certain performance limitations may be observed. For example, a silicone-surfaced dry plate may exhibit insufficient retention of ink by the exposed ink-receptive layer. The source of this behavior, however, is complex; it does not arise merely from stubbornly adherent silicone fragments. Simple mechanical rubbing of the silicone layer, for example, reliably removes from the ink-accepting layer all debris visible even under magnification, and well before damage to the non-imaged silicone areas might occur. Nonetheless, such plates still may print with the inferior quality associated with inadequate affinity for ink. And while ink acceptance can be improved through cleaning with a solvent, this process can soften the silicone as well as degrade its anchorage to non-imaged portions of the plate. Solvents also raise environmental, health and safety concerns. Similar limitations may be observed in wet lithographic printing members having hydrophilic surface layers disposed over oleophilic sublayers.

Study of the imaging process and its effect on certain types of plate constructions, particularly those containing thin-metal imaging layers below silicone top coatings, suggests that the observed printing deficiencies arise from subtle chemical and morphological changes induced by the imaging process. Because the metal imaging layer is in contact with the chemically complex silicone layer, the high temperatures attained during imaging can induce unwanted thermal reactions that produce silicone-derived products. These breakdown products may interact both chemically and mechanically with the underlying ink-receptive substrate surface. That surface, moreover, is also rendered more vulnerable to interaction with silicone breakdown products as a result of exposure to high temperatures, which can melt and thermally degrade the surface of the substrate so that it readily accepts breakdown products. In both dry and wet plate constructions, the adhesion, implantation, mechanical intermixture, and chemical reaction of breakdown products from the surface layer with the underlying oleophilic layer(s) interferes with the printing member's ability to retain ink.

In addition, existing lithographic printing members have the propensity to build up static charge during the coating, handling, cleaning, and printing processes. This can lead to static discharge which poses health and safety hazards. Finally, while on press, the act of "dry rousting" (i.e., rubbing the surface with a dry rubber roll to remove the bulk of the imaging debris), or, in the case of dry printing members, the simple act of printing without water, can also build up a static charge. Spark discharges can jump from one conductive non-image area to another, causing non-conductive image areas to ablate post-imaging, thus creating additional unwanted ink-receptive areas.

SUMMARY OF THE INVENTION

The present invention utilizes a primer layer disposed between the imaging layer and the substrate of a lithographic printing member. The primer layer inhibits the production of thermal degradation products that disrupt the oleophilicity of the exposed imaged areas, thereby improving print-making performance and efficiency. In addition, embodiments of the primer layer inhibit static charge buildup during production and during the print-making process.

In a first aspect, the invention provides lithographic printing member having a polymeric substrate, a primer layer disposed thereover, an imaging layer disposed over the primer layer, and a surface layer disposed over the imaging layer. The primer layer includes a surface-tension modifier dispersed in a polymeric binder. The surface layer and at least one of the primer layer and the substrate have opposite affinities for ink and/or a liquid to which ink will not adhere.

The polymeric binder can include cellulose esters (e.g., cellulose acetate, cellulose acetate propionate, cellulose acetate butyrate, cellulose nitrate, and combinations thereof), polyacrylics, polyurethanes, polyvinyl alcohols, polyvinyl esters, polyvinyl acetals, polyvinyl ethers, polyvinyl ketones, polyvinyl carbazoles, vinyl butyral, and combinations thereof. The surface-tension modifier can include metal oxide particles (e.g., particles of $TiO_2$, $SiO_2$, $ZrO_2$, $Al_2O_3$, ZnO, and combinations thereof), metal nitride particles (e.g., particles of BN, AlN, TiN, ZrN, VN, and combinations thereof), inorganic salt particles (e.g., BaSO4, $CaCO_3$, $BaTiO_3$, $CaSiO_3$, and combinations thereof), glass particles, plastic particles, and combinations thereof. The surface-tension modifier can include hollow or porous particles. The primer layer can also include a dye. In some embodiments, the primer Layer includes not less than 50%, or not less than 75%, surface-tension modifier by weight. In certain embodiments, the primer layer has a surface tension of at least about 45 dyne/cm, 55 dyne/cm, 65 dyne/cm, or 75 dyne/cm. The primer layer can have an $R_z$ value of about 7.5

μm to about 8.5 μm and/or an $R_a$ value of about 550 nm to about 560 nm. In some embodiments, the primer layer is oleophilic.

The polymeric substrate can include polyesters, polycarbonates, polystyrene, polysulfones, cellulose acetate, polyimides, polyamides, and combinations thereof. In some embodiments, the substrate is oleophilic. The imaging layer can include a metal (e.g., titanium, aluminum, zinc, chromium, vanadium, zirconium and alloys thereof), or a polymer, which optionally includes an IR-absorber dispersed therein.

In some embodiments, the surface layer is oleophobic. Suitable materials for fabricating the surface layer include silicone polymers, fluoropolymers, fluorosilicone polymers, and combinations thereof. In other embodiments, the surface layer is made of a hydrophilic material, such as polyvinyl alcohol. At least a portion of the imaging layer may ablate when exposed to imaging radiation. In certain embodiments, the surface layer and the imaging layer are removed where the lithographic printing member received imaging radiation.

In another aspect, the invention provides a method of imaging the lithographic printing member described above. The printing member is exposed to imaging radiation in an imagewise pattern, which heats the portions of the imaging layer exposed to the radiation sufficiently to cause separation from and at least partial degradation of the surface layer. At least the portions of the surface layer in the imaged areas are removed to create an imagewise lithographic pattern on the printing member.

It should be stressed that, as used herein, the term "plate" or "member" refers to any type of printing member or surface capable of recording an image defined by regions exhibiting differential affinities for ink. Suitable configurations include the traditional planar or curved lithographic plates that are mounted on the plate cylinder of a printing press, but can also include seamless cylinders (e.g., the roll surface of a plate cylinder), an endless belt, or other arrangement.

Furthermore, the term "hydrophilic" is used in the printing sense to connote a surface affinity for a fluid which prevents ink from adhering thereto. Such fluids include water for conventional ink systems, aqueous and non-aqueous dampening liquids, and the non-ink phase of single-fluid ink systems. Thus, a hydrophilic surface in accordance herewith exhibits preferential affinity for any of these materials relative to oil-based materials.

BRIEF DESCRIPTION OF THE DRAWINGS

The foregoing discussion will be understood more readily from the following detailed description of the invention when taken in conjunction with the accompanying drawings. In the drawings, like reference characters generally refer to the same parts throughout the different views. Also, the drawings are not necessarily to scale, emphasis instead generally being placed upon illustrating the principles of the invention.

DETAILED DESCRIPTION

1. Imaging Apparatus

Figure 1:
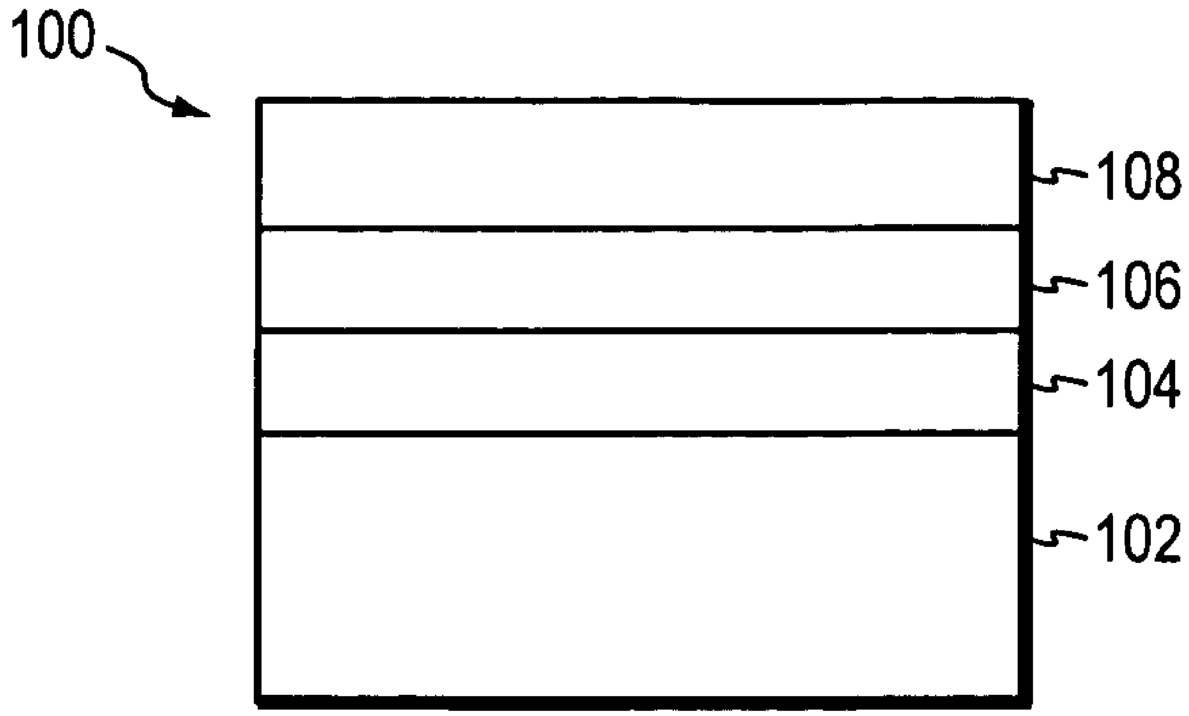
FIG. 1 is an enlarged sectional view of an embodiment of a printing member according to the invention that contains substrate, a primer layer, an imaging layer, and a surface layer.

An imaging apparatus suitable for use in conjunction with the present printing members includes at least one laser device that emits in the region of maximum plate responsiveness, i.e., whose $\lambda_{max}$ closely approximates the wavelength region where the plate absorbs most strongly. Specifications for lasers that emit in the near-IR region are fully described in U.S. Pat. No. Re. 35,512 ("the '512 patent") and U.S. Pat. No. 5,385,092 ("the '092 patent"), the entire disclosures of which are hereby incorporated by reference. Lasers emitting in other regions of the electromagnetic spectrum are well-known to those skilled in the art.

Suitable imaging configurations are also set forth in detail in the '512 and '092 patents. Briefly, laser output can be provided directly to the plate surface via lenses or other beam-guiding components, or transmitted to the surface of a blank printing plate from a remotely sited laser using a fiber-optic cable. A controller and associated positioning hardware maintain the beam output at a precise orientation with respect to the plate surface, scan the output over the surface, and activate the laser at positions adjacent selected points or areas of the plate. The controller responds to incoming image signals corresponding to the original document or picture being copied onto the plate to produce a precise negative or positive image of that original. The image signals are stored as a bitmap data file on a computer. Such files may be generated by a raster image processor ("RIP") or other suitable means. For example, a RIP can accept input data in page-description language, which defines all of the features required to be transferred onto the printing plate, or as a combination of page-description language and one or more image data files. The bitmaps are constructed to define the hue of the color as well as screen frequencies and angles.

Other imaging systems, such as those involving light valving and similar arrangements, can also be employed; see, e.g., U.S. Pat. Nos. 4,577,932; 5,517,359; 5,802,034; and 5,861,992, the entire disclosures of which are hereby incorporated by reference. Moreover, it should also be noted that image spots may be applied in an adjacent or in an overlapping fashion.

The imaging apparatus can operate on its own, functioning solely as a platemaker, or can be incorporated directly into a lithographic printing press. In the latter case, printing may commence immediately after application of the image to a blank plate, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In the drum configuration, the requisite relative motion between the laser beam and the plate is achieved by rotating the drum (and the plate mounted thereon) about its axis and moving the beam parallel to the rotation axis, thereby scanning the plate circumferentially so the image "grows" in the axial direction. Alternatively, the beam can move parallel to the drum axis and, after each pass across the plate, increment angularly so that the image on the plate "grows" circumferentially. In both cases, after a complete scan by the beam, an image corresponding (positively or negatively) to the original document or picture will have been applied to the surface of the plate.

In the flatbed configuration, the beam is drawn across either axis of the plate, and is indexed along the other axis after each pass. Of course, the requisite relative motion between the beam and the plate may be produced by movement of the plate rather than (or in addition to) movement of the beam.

Regardless of the manner in which the beam is scanned, in an array-type system for on-press applications it is generally preferable to employ a plurality of lasers and guide their outputs to a single writing array. The writing array is then indexed, after completion of each pass across or along the plate, a distance determined by the number of beams emanating from the array, and by the desired resolution (i.e., the number of image points per unit length). Off-press applications, which can be designed to accommodate very rapid scanning (e.g., through use of high-speed motors, mirrors, etc.) and thereby utilize high laser pulse rates, can frequently utilize a single laser as an imaging source.

2. Lithographic Printing Members

FIG. 1 illustrates an embodiment of a printing member 100 according to the invention that includes a polymeric substrate 102, a primer layer 104, an imaging layer 106, and a surface Layer 108. Each of these layers and their functions will be described in detail below.

Polymeric Substrate 102. The polymeric substrate 102 provides dimensionally stable mechanical support to the printing member 100. The polymeric substrate 102 should be strong, stable, and flexible. In addition, the polymeric substrate 102 should be made of a polymer which will form a strong bond with the primer layer 104. Materials suitable for use in the polymeric substrate 102 include, but are not limited to, polyesters (e.g., polyethylene terephthalate and polyethylene naphthalate), polycarbonates, polyurethane, acrylic polymers, polyamide polymers, polyimide polymers, phenolic polymers, polysulfones, polystyrene, and cellulose acetate. A preferred polymeric substrate is polyethylene terephthalate film, such as the polyester films MYLAR and MELINEX (E. I. duPont de Nemours Co., Wilmington, Del.), for example. The polymeric substrate 102 can have a thickness ranging from about 50 μm to about 500 μm or more, depending on the specific application.

The polymeric substrate 102 can be oleophilic or oleophobic. However, it is preferable to provide an oleophilic polymeric substrate 102 to promote adhesion and to accommodate damage to the primer layer 104 without loss of performance. Specifically, in preferred embodiments where the primer layer 104 is not removed during the imaging process, it can still be scratched or damaged during the printmaking process. A polymeric substrate 102 of like affinity will accept ink in the same manner as the overlying primer layer 104 in those areas where the primer layer 104 is damaged, thus maintaining print quality and prolonging the useful life of the printing member 100.

To impart additional strength to the polymeric substrate 102, it is possible to utilize the approach described in U.S. Pat. No. 5,188,032 (the entire disclosure of which is hereby incorporated by reference). As discussed in that application, a metal sheet (e.g., aluminum or steel) can be laminated to the polymeric substrate 102. Suitable metals, laminating procedures, and preferred dimensions and operating conditions are all described in the '032 patent, and can be straightforwardly applied to the present context without undue experimentation.

Primer Layer 104. The primer layer 104 inhibits interaction between the substrate 102 and post-imaging debris from the imaging layer 106. In preferred embodiments, the primer layer 104 is oleophilic and acts as the ink-accepting portion of the lithographic printing member 100. The primer layer 104 should form a strong bond with the polymeric substrate 102 and the imaging layer 106, but the bond with the imaging layer 106 should be readily weakened during laser imaging.

It was discovered that merely adding an oleophilic primer layer did not alleviate the problem of reduced print quality due to post-imaging thermal degradation products; in some cases, the ink-receptivity of the resulting plates were worsened. However, when surface-tension modifiers were added to the primer layer, dramatic improvements in post-imaging ink-receptivity were observed. The ink-receptivity of the primer layer is related to its surface tension: as the surface tension increases, the number of sheets of paper required to reach a stable target ink density (i.e., the "roll-up" time) decreases. For example, primer layers made of a surface-tension modifier dispersed in a polymeric binder exhibited surface tensions of about 50–70 dyne/cm prior to imaging. After imaging and cleaning, the surface tensions remained at 45–65 dyne/cm, and the roll-up times were in the range of 10–50 impressions. In comparison, the surface tension of primer layers containing only an oleophilic polymer dropped to 30–40 dyne/cm after imaging and cleaning, and the roll-up times were about 200–500 impressions. Preferably, the primer layer has a surface tension of at least about 45 dyne/cm, more preferably at least about 55 dyne/cm, and ideally at least about 65 dyne/cm or even 75 dyne/cm.

Another factor that influences the ink-receptivity of the primer layer is the roughness of its surface. Roughness is typically expressed as the mean roughness value ($R_a$) and/or the mean roughness depth value ($R_z$). The $R_a$ value represents the arithmetic mean of the deviation from the center line of a surface; it is calculated by dividing the total area of the peaks and valleys of the surface by the length, and is generally expressed in nanometers (nm). The $R_z$ value represents the arithmetic mean of the difference between the highest peak to the deepest valley of a surface, and is generally expressed in micrometers (μm). Generally, as the roughness values $R_a$ and $R_z$ increase, the surface tension of the primer layer increases, which leads to greater ink-receptivity. However, if the surface of the primer layer is too rough, the overlying imaging layer may become uneven, which can result in poor imaging performance. Thus, the roughness of the primer layer must be optimized to balance ink-receptivity and the surface topography of the imaging layer. In preferred embodiments, the primer layer has an $R_z$ value of about 7.5 μm to about 8.5 μm and/or an $R_a$ value of about 550 nm to about 560 nm.

The polymeric binder should form a strong bond with the surrounding layers and also be compatible with the surface-tension modifier. Suitable materials include, for example, cellulose esters (e.g., cellulose acetate, cellulose acetate propionate, cellulose acetate butyrate, and cellulose nitrate), acrylic polymers, polyurethanes, vinylic polymers (e.g., polyvinyl alcohols, polyvinyl esters, polyvinyl acetals, polyvinyl ethers, polyvinyl ketones, polyvinyl carbazoles, and vinyl butyral), and combinations thereof.

The surface-tension modifier should be chosen to impart the necessary surface tension and roughness to the primer layer 104 without impairing the imaging sensitivity of the printing member 100. For example, surface-tension modifiers that are too thermally conductive can absorb heat from the imaging layer, reducing the sensitivity of the printing member. In addition, suitable materials may be chosen based upon other factors, including, for example, particle size; density; compatibility with the polymeric binder, coating solvents, etc.; light absorption, scattering, etc.; and cost and safety considerations. Suitable materials for the surface-tension modifier include, for example, metal oxide particles, metal nitride particles, inorganic salt particles, glass particles, and plastic particles. Suitable metal oxides include, but are not limited to, $TiO_2$, $SiO_2$, $ZrO_2$, $Al_2O_3$, ZnO, and combinations thereof. Suitable metal nitride particles include, but are not limited to BN, AlN, TiN, ZrN, VN, and combinations thereof. Suitable inorganic salts include, but are not limited to, $BaSO_4$, $CaCO_3$, $BaTiO_3$, $CaSiO_3$, and combinations thereof. The particles that make up the surface-tension modifier can be substantially solid, or they can be hollow or porous. Examples include hollow glass microspheres (available, for example, from 3M Corporation, Maplewood, Minn.), hollow plastic particles (available, for example, from BASF, Mount Olive, N.J.), and hollow or porous nodules of $ZrO_2$. The particles that make up the surface-tension modifier can have any of a number of shapes, such as, for example, spherical, crystalline, fibrous, or amorphous shapes. The surface-tension modifier particles can have any size that is compatible with the thickness of the primer layer 104. In addition, the primer layer 104 may include a combination of one or more types and sizes of surface-tension modifiers.

The surface tension of the primer layer 104 can also be modified by adjusting the amount of surface-tension modifier present in the polymeric binder. Generally, the surface tension increases as the weight % of the surface-tension modifier increases. However, too great an amount of surface-tension modifier can make the surface of the primer layer 104 uneven, which can translate into an uneven imaging layer 106, resulting in poor imaging performance. Preferably, the primer layer 104 includes at least 50% by weight of the surface-tension modifier, and in some embodiments, at least 75% by weight. Other factors, including particle size, the degree of dispersion within the polymeric binder, and the particle size distribution, also affect the surface tension of the primer layer 104.

The primer layer 104 can also include other materials, including, for example, pigments or dyes that facilitate quality inspection during coating. Pigments and dyes should be compatible with the polymeric binder and the surface-tension modifiers, and preferably are oleophilic. An example of a suitable dye is the triphenylmethane dye Victoria Blue.

Imaging Layer 106. The imaging layer 106 absorbs imaging radiation and is detached from the surface layer 108 (e.g., by ablation, partial ablation, or a heat-induced, non-ablative detachment mechanism), thereby facilitating removal of the overlying surface layer 108 so as to produce an image on the printing member 100. The imaging layer 106 can be oleophilic or oleophobic; if it is removed as a result of imaging, the lithographic affinity of the imaging layer 106 is unimportant. The imaging layer 106 should form a strong bond to the primer layer 104 and the surface layer 108, but the bonds should be easily weakened during laser imaging. Suitable materials for the imaging layer 106 include, but are not limited to, metals, ceramics and polymers.

Suitable metals for the imaging layer 106 include, but are not limited to, titanium, aluminum, zinc, chromium, vanadium, zirconium, and alloys thereof. Brief exposure of a metal imaging layer 106 to a laser pulse can ablate the metal, or heat the metal without ablating it, detaching it from the overlying surface layer 108. In preferred embodiments, the imaging layer 106 also is detached from the underlying primer layer 104. Depending on design, cleaning can either remove the imaging layer 106 in its entirety along with detached portions of the overlying surface layer 108, or can instead leave the imaging layer 106 either in whole or in part. Because metals typically retain applied ink, it is often unnecessary to achieve complete removal in any case. Nonetheless, a metal imaging layer 106 is preferably thin (e.g., about 50 Å to about 500 Å) to minimize heat transport within layer 106 (i.e., transverse to the direction of the imaging pulse), thereby concentrating heat within the region of the imaging pulse so as to effect image transfer at minimal imaging power. In a particular embodiment, the imaging layer 106 is titanium applied (e.g., by sputtering or vacuum deposition) at a thickness of about 300 Å or less.

Titanium layers exhibit substantial resistance to handling damage; this feature is important both to production, where damage to the imaging layer 106 can occur prior to the addition of the surface layer 108, and in the printing process itself, where weak intermediate layers can reduce plate life. Titanium further enhances plate life through resistance to interaction with ink-borne solvents that, over time, may migrate through the surface layer 108; other materials, such as organic layers, may exhibit permeability to such solvents and allow plate degradation. Moreover, silicone surface layers 108 applied to titanium layers tend to cure at faster rates and at lower temperatures, thereby avoiding thermal damage to the polymer substrate 102. Titanium also provides advantageous environmental and safety characteristics: its ablation does not produce measurable emission of gaseous byproducts, and environmental exposure presents minimal health concerns. Finally, titanium, like many other metals, exhibits some tendency to interact with oxygen during the deposition process (vacuum evaporation, electron-beam evaporation or sputtering); however, the lower oxides of titanium most likely to be formed in this manner (particularly TiO) are strong absorbers of near-IR imaging radiation. In contrast, the likely oxides of aluminum, zinc and bismuth are relatively poor absorbers of such radiation.

Alternatively, the imaging layer 106 may be a metallic inorganic layer. The metal component of a suitable metallic inorganic material may be a d-block (transition) metal, an f-block (Lanthanide) metal, aluminum, indium or tin, or a mixture of any of the foregoing (an alloy or, in cases in which a more definite composition exists, an intermetallic). Suitable metals include, for example, titanium, zirconium, vanadium, niobium, tantalum, molybdenum and tungsten. The non-metal component may be one or more of the p-block elements boron, carbon, nitrogen, oxygen and silicon. A metal/non-metal compound in accordance herewith may or may not have a definite stoichiometry, and may in some cases (e.g., Al—Si compounds) be an alloy. Metal/non-metal combinations include, for example, TiN, TiON, $TiO_x$, (where $0.9 \leqq x \leqq 2.0$), TiAlN, TiAlCN, TiC, and TiCN.

Also, the imaging layer 106 may be a ceramic layer. Ceramics include refractory oxides, carbides, and nitrides of metals and non-metals. Suitable ceramic materials include, but are not limited to, interstitial carbides (e.g., TiC, ZrC, HfC, VC, NbC, and TaC), covalent carbides (e.g., $B_4C$ and SiC), and interstitial nitrides (e.g., TiN, ZrN, HfN, VN, NbN, TaN, BN, and $Si_3N_4$). Other suitable ceramic materials are straightforwardly identified by those of skill in the art, e.g., by reference to Pierson, "Handbook of Refractory Carbides and Nitrides" (1996, William Andrew Publishing, N.Y.) (incorporated herein by reference). Ceramic imaging layers may also include dopants, such as copper, for example. Ceramic imaging layers 106 can be deposited using any vacuum deposition technique known in the art suitable for deposition of inorganic compounds. Magnetron sputtering deposition is a preferred technique because of the well-known advantages for coating of large area substrates. The magnetron sputtering process is typically carried out at pressures in the order of about $10^{-5}$ Torr. This low pressure reduces the amount of water and other contaminants that could affect the properties of the ceramic imaging layer. For example, reduction or elimination of oxygen in the deposition system is important because oxygen can react with the metal species during the magnetron deposition process, leading to the deposition of non-stoichiometric ceramic films with degraded optical, thermal, and mechanical properties. Selection of optimum deposition conditions for films with selected atomic composition is well within the skill of practitioners in the art. Ceramic imaging layers 106 are generally applied in thicknesses ranging from about 20 nm to about 45 nm.

Further, polymers suitable for use in imaging layers 106 according to the invention may inherently IR-absorbing (e.g., polypyrroles) or may contain one or more IR-absorbing additives dispersed therein. Suitable polymers include, but are not limited to, vinyl-type polymers (e.g., polyvinyl alcohol) polyurethanes, polypyrroles, polyimides, polyamides, poly(amide-imide), cellulosic polymers (e.g., nitrocellulose), polycyanoacrylates, and epoxy polymers. The imaging layers may also be formed from a combination of one or more polymers, such as nitrocellulose in combination with a vinyl-type polymer.

Suitable IR-absorbing materials include a wide range of organic and inorganic dyes and pigments, such as carbon black (e.g., CAB-O-JET 200, sold by Cabot Corporation, Bedford, Mass., and BONJET BLACK CW-1, sold by Orient Corporation, Springfield, N.J.), nigrosine-based dyes, cyanine dyes (e.g., indolenine dye), anthraquinone-based dyes, phthalocyanine-based dyes, azulene-based dyes, organometallic dyes (e.g., dithiol-nickel complexes), phthalocyanines (e.g., aluminum phthalocyanine chloride, titanium oxide phthalocyanine, vanadium (IV) oxide phthalocyanine, and the soluble phthalocyanines supplied by Aldrich Chemical Co., Milwaukee, Wis.), naphthalocyanines, iron chelates, nickel chelates, oxoindolizines, iminium salts, and indophenols, for example. Preferably, the pigments and/or dyes absorb radiation in the range of about 700 to about 900 nm. Any of these materials may be dispersed in a prepolymer before cross-linking into a final film. Alternatively, the absorber may be a chromophore chemically integral with the polymer backbone; see, e.g., U.S. Pat. No. 5,310,869 (the entire disclosure of which is incorporated by reference herein). Polymeric imaging layers 106 can include other additives known in the art, including, for example, cross-linking agents.

Polymeric imaging layers 106 can be applied using any coating technique known in the art such as wire-wound rod coating, reverse roll coating, gravure coating, or slot die coating, for example. U.S. Pat. No. 5,339,737 (the entire disclosures of which is incorporated by reference herein) and the '512 patent describe numerous formulations and coating techniques suitable for polymeric imaging layers 106 according to the invention.

Surface Layer 108. In dry-plate embodiments, the surface layer 108 is oleophobic and repels ink; the portions of the surface layer 108 that remain after imaging make up the non-image portions of the printing member 100. In wet-plate embodiments, the surface layer 108 is also hydrophilic. The surface layer 108 should be substantially transparent to imaging radiation and should form a strong bond to the underlying imaging layer 106.

Suitable materials for a dry-plate surface layer 108 include silicone polymers, fluoropolymers, and fluoro-silicone polymers. Silicone polymers are based on the repeating diorganosiloxane unit $(R_2SiO)_n$, where R is an organic radical or hydrogen and n denotes the number of units in the polymer chain. Fluorosilicone polymers are a particular type of silicone polymer wherein at least a portion of the R groups contain one or more fluorine atoms. The physical properties of a particular silicone polymer depend upon the length of its polymer chain, the nature of its R groups, and the terminal groups on the end of its polymer chain. Any suitable silicone polymer known in the art may be incorporated into the surface layer 108.

Silicone polymers are typically prepared by cross-linking (or "curing") diorganosiloxane units to form polymer chains. The resulting silicone polymers can be linear or branched. A number of curing techniques are well known in the art, including condensation curing, addition curing, and moisture curing. In addition, silicone polymers can include one or more additives, such as adhesion modifiers, rheology modifiers, colorants, and radiation-absorbing pigments, for example.

Examples of suitable fluoropolymers include polytetrafluoroethylene (PTFE), perfluoroalkoxy (PFA), fluorinated ethylene propylene (FEP), ethylene tetrafluoroethylene (ETFE), polytetrafluoroethylene perfluoromethylvinylether (MFA), or tetrafluoroethylene hexafluoropropylene vinylidene (THV). Any suitable fluoropolymer known in the art may be incorporated into the surface layer 108.

Suitable materials for a wet-plate surface layer 108 include low molecular weight, water-soluble polymers, such as polyvinyl alcohol. For example, the surface layer 108 may include a fully hydrolyzed polyvinyl alcohol (e.g., CELVOL 305, 325 and 425 sold by Celanese Chemicals, Ltd. Dallas, Tex.), which is usually manufactured by hydrolysis of polyvinyl acetates. The use of fully hydrolyzed alcohol is preferred to assure that residual non-hydrolyzed acetate does not affect the hydrophilic behavior of the surface. The presence of residual polyvinyl acetate moieties in the protective layer promotes interaction of the non-image areas of the printing member with printing inks, which can diminish print quality. Any suitable hydrophilic polymer known in the art may be incorporated into the surface layer 108.

The surface layer 108 can be applied to the printing member 100 using any of a variety of well-known coating techniques. Typical coating techniques include roll coating, reverse-roll coating, gravure coating, offset-gravure coating, and wire-wound rod coating. The coating procedure should be rapid enough to achieve a satisfactory production rate, yet produce a highly uniform, smooth, level coating on the printing member 100. U.S. Pat. Nos. 5,188,032, 5,212,048, 5,310,869, and 5,339,737 (the entire disclosures of which are incorporated by reference herein) describe numerous formulations and coating techniques suitable for surface layers 108 according to the invention.

3. Imaging Techniques

Figure 2A:
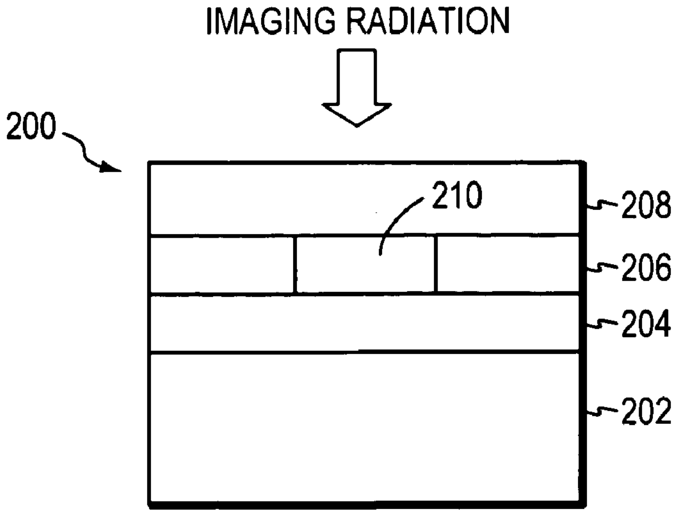
FIGS. 2A–2C are enlarged sectional views of a printing member illustrating an imaging mechanism according to the invention.
Figure 2B:
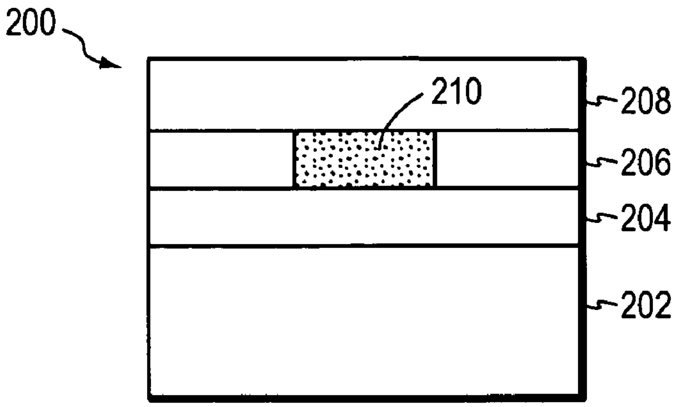
Figure 2C:
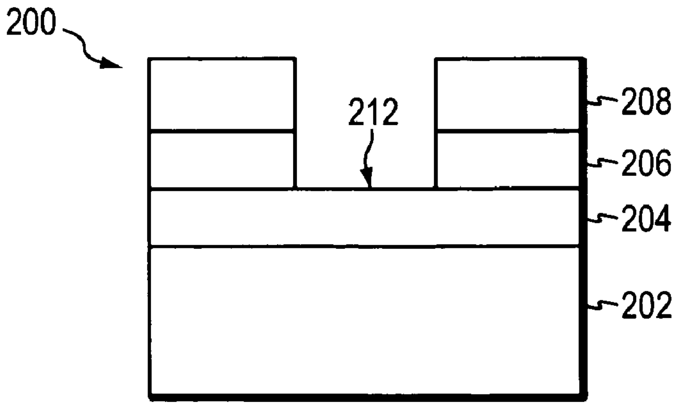

FIGS. 2A–2C illustrate the consequences of imaging an embodiment of a printing member 200 according to the invention, which includes a substrate 202, a primer layer 204, an imaging layer 206, and a surface layer 208. As illustrated in FIG. 2A, the exposed area 210 of the imaging layer 206 absorbs the imaging pulse and converts it to heat. The heat causes the imaging Layer 206 to separate from the surface layer 208, and at least partially degrades the surface layer 208. In some embodiments, the imaging layer 206 ablates in response to the imaging radiation, as illustrated in FIG. 2B. In other embodiments, the heat disrupts the bond between the imaging layer 206 and the surface layer 208 (and, optionally, between the imaging layer 206 and the primer layer 204) without substantial ablation.

After imaging, at least the imaged portions of the surface layer 208 are removed to expose an oleophilic surface below. In preferred embodiments, both the surface layer 208 and the imaging layer 206 are removed in the areas that received imaging radiation, as shown in FIG. 2C. In other embodiments, at least a portion of the primer layer 204 is degraded and removed in the areas that received imaging radiation. The imaging debris can be removed in a post-imaging cleaning step (e.g., with a cleaning liquid or by dry-rubbing), or by repeatedly subjecting the printing member 200 to the print-making process until prints of sufficient quality are produced. The exposed oleophilic areas (e.g., area 212 in FIG. 2C) are ink-receptive and serve as the image areas of the printing member 200. In dry printing member embodiments, the non-imaged portions of the surface layer 208 are oleophobic and reject ink. In wet-printing embodiments, the non-imaged portions of the surface layer 208 are hydrophilic and accept fountain solution, thus repelling ink.

4. EXAMPLES

Several embodiments of the present invention are described in the following examples, which are meant to illustrate, not to limit, the scope and nature of the present invention.

Example 1

The following experiments illustrate the effect that increasing amounts of surface-tension modifier in the polymeric binder has on the surface tension and roughness of primer layers according to the invention. Six dry lithographic plates were constructed according to the invention, each plate including a polyester substrate, a primer layer made of a cellulose acetate propionate (CAP) binder having various weight % of $TiO_2$ particles dispersed therein, a titanium metal imaging layer, and a silicone surface layer. The ratio of $TiO_2$ to CAP for each plate is listed in Table 1 below.

Each plate was imaged on a Dimension 400 imager (Presstek, Inc., Hudson, N.H.), and the imaging residue was removed by machine cleaning (Javin Machine Corp, West Babylon, N.Y.). The surface tension of the imaged areas of each plate were then measured using standard techniques with solutions containing formamide and either 2-ethoxyethanol or reagent grade water (Diversified Enterprises, Claremont, N.H.). The results for each plate are summarized in FIG. 3 and Table 1 below.

TABLE 1

| Plate | $TiO_2$:CAP ratio | Surface tension (dyne/cm) | $R_z$ (μm) |
|---|---|---|---|
| 1 | 3.0 | 56 | 7.72 |
| 2 | 2.5 | 52 | — |
| 3 | 2.1 | 46 | 5.81 |
| 4 | 1.7 | 36 | — |
| 5 | 1.5 | 32 | 5.21 |
| 6 | 1.1 | 30 | 5.01 |

Figure 3:
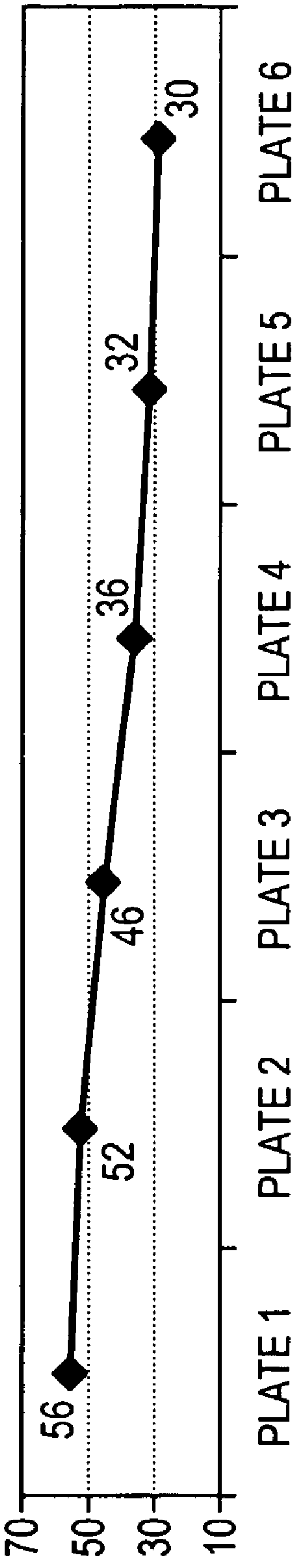
FIG. 3 is a graphical representation of the surface tensions of various primer layers according to the invention.

As FIG. 3 and Table 1 illustrate, increasing the ratio of $TiO_2$ to CAP binder increases the surface tension of the primer layer.

Figure 4:
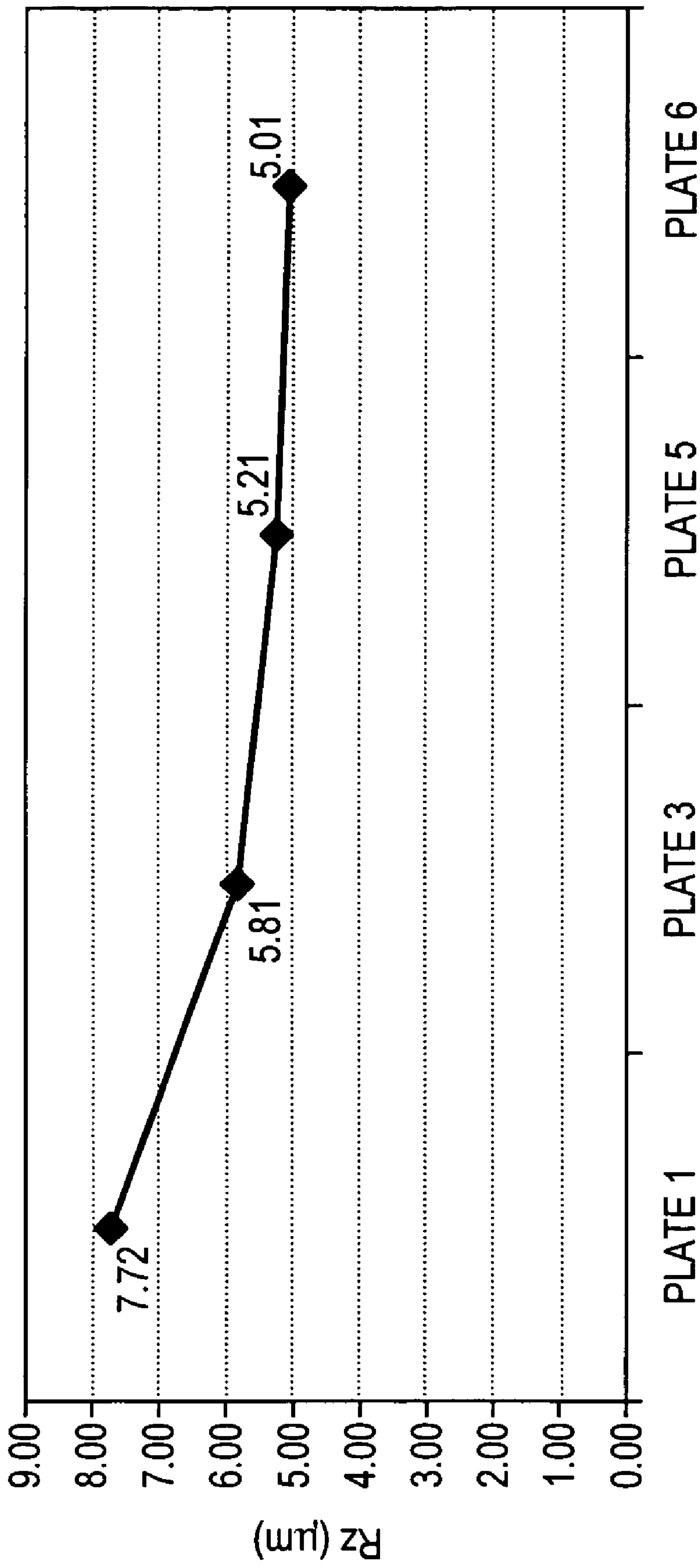
FIG. 4 is a graphical representation of the roughness values of various primer layers according to the invention.

In addition, the mean roughness depth value ($R_z$) of the exposed portions of the primer layers was measured for Plates 1, 3, 5, and 6. The $R_z$ value was determined using a laser profilometer according to procedures well known in the art. The results of the experiments are summarized in FIG. 4 and in Table 1 above, illustrating that, along with increasing the surface tension, increasing the ratio of $TiO_2$ to CAP binder increases the roughness of the primer layer.

Example 2

The following experiments illustrate the effect that primer layers according to the invention have on the time it takes to achieve a target average ink density (i.e., roll-up time). Four dry lithographic plates were constructed as follows:

| | Substrate | Primer Layer | Imaging Layer | Surface Layer |
|---|---|---|---|---|
| Plate 7 | Polyester | None | titanium | silicone |
| Plate 8 | Polyester | 3:1 $SiO_2$/nitrocellulose | titanium | silicone |
| Plate 9 | Polyester | 2:1 Zelec ECP 3010 (antimony-doped tin oxide, Milliken Chemical, Spartanburg, SC)/cellulose acetate butyrate | titanium | silicone |
| Plate 10 | Polyester | 3:1 $TiO_2$/cellulose acetate butyrate | titanium | silicone |

Each plate was imaged on a Dimension 400 imager (Presstek, Inc., Hudson, N.H.). Immediately after imaging, 1000 prints were produced from each plate using Toyo ink (Toyo Ink, Addison, Ill.), and the ink densities of the prints were measured at set intervals. Ink densities were measured using a Macbeth Status T densitometer (Amazys Holding AG, Regensdorf, Switzerland) in a solid area in the same position on each sheet. The ink density of each sheet was measured three times (with all density readings falling within ±0.05), and the values were averaged. Plate 7, which did not contain a primer layer, was washed with a solvent (PEARLdry cleaner fluid, Presstek, Inc., Hudson, N.H.) after 1000 prints, and an additional 1000 prints were produced. The results of the experiments are summarized in FIG. 5 and Table 2 below.

TABLE 2

| | Ink Density | | | |
|---|---|---|---|---|
| Sheet # | Plate 7 | Plate 8 | Plate 9 | Plate 10 |
| 10 | 1.68 | 1.86 | 1.76 | 1.80 |
| 50 | 1.48 | 1.75 | 1.68 | 1.77 |
| 150 | 1.24 | 1.70 | 1.64 | 1.77 |
| 250 | 1.40 | 1.72 | 1.64 | 1.78 |

TABLE 2-continued

| | Ink Density | | | |
|---|---|---|---|---|
| Sheet # | Plate 7 | Plate 8 | Plate 9 | Plate 10 |
| 500 | 1.38 | 1.74 | 1.69 | 1.80 |
| 750 | 1.48 | 1.72 | 1.78 | 1.79 |
| 1000 | 1.56 | 1.72 | 1.76 | 1.81 |
| 1050 | 1.76 | — | — | — |
| 1250 | 1.63 | — | — | — |
| 1500 | 1.67 | — | — | — |
| 2000 | 1.67 | — | — | — |

Figure 5:
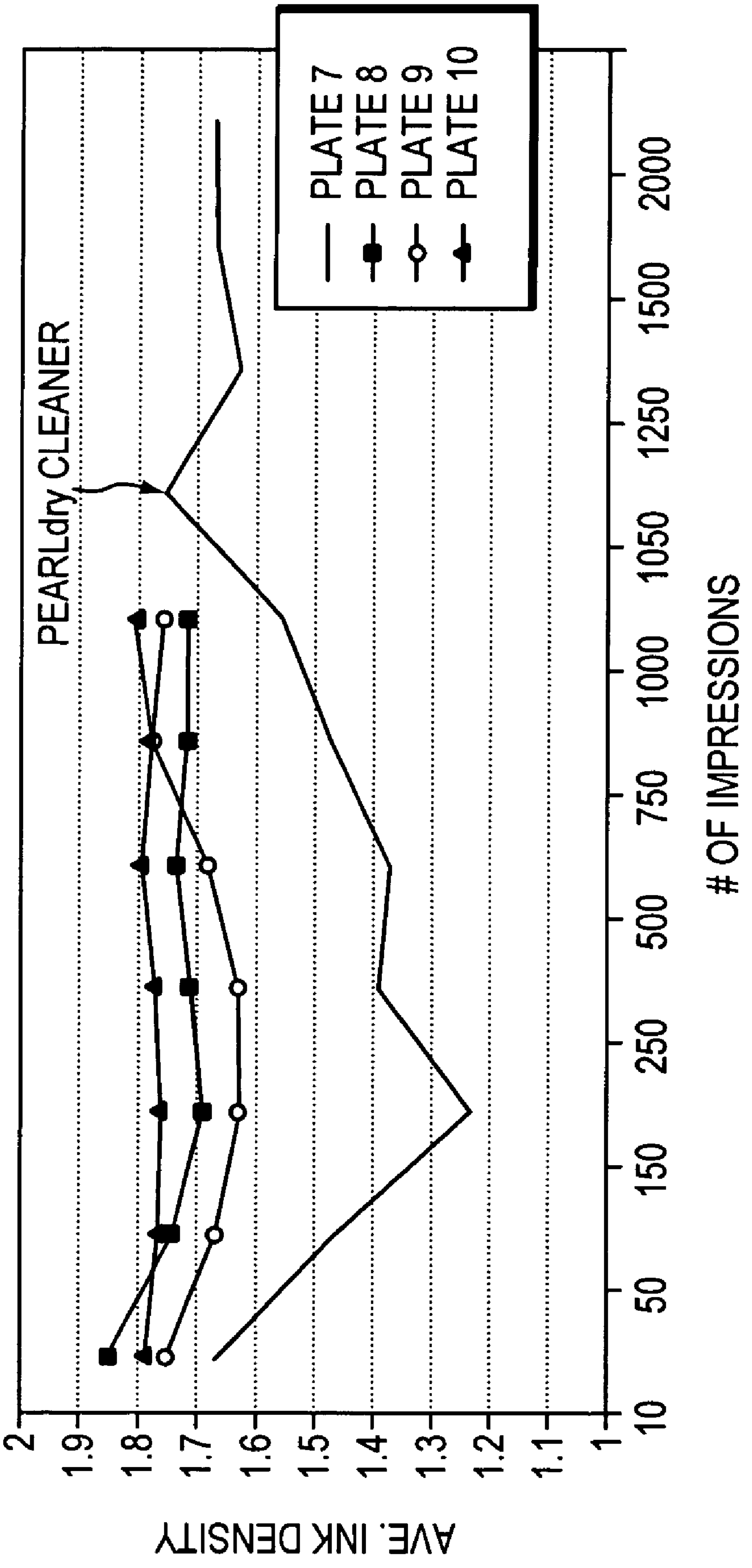
FIGS. 5, 6, and 7 are graphical representations of the average ink densities of prints made by a control plate and various printing members according to the invention.

As FIG. 5 and Table 2 indicate, all four plates appeared to reach a high average ink density within the first 50 sheets, but the prime-coated plates (i.e., Plates 8–10) achieved a higher density than the control plate (i.e., Plate 7), which did not contain a primer layer. However, the high ink density achieved by Plate 7 was not sustainable and took time to re-establish. Even after cleaning, the ink density of Plate 7 was not as stable as that of Plates 8–10. Of the prime-coated samples, Plate 10, which contained a 3:1 $TiO_2$/cellulose acetate butyrate primer layer, exhibited the best average ink density. Plate 10 had a surface tension of 58 dyne/cm after imaging and cleaning, as compared to 35 dyne/cm for Plate 7 (even after the solvent cleaning step, Plate 7 exhibited a surface tension of only 38 dyne/cm). These experiments illustrate that printing members having primer layers that contain surface-tension modifiers dispersed within a polymeric binder can increase the speed at which prints are produced while maintaining print quality.

Example 3

The following experiments investigated the effect that primer layers according to the invention have on roll-up time using a different ink. Four dry lithographic plates were constructed according to Example 2 above, and each plate was imaged using a Dimension 400 imager (Presstek, Inc., Hudson, N.H.). Immediately after imaging, 500 prints were produced from each plate using K&E ink (BASF, Mount Olive, N.J.), and the average ink density of the prints were measured at set intervals using a Macbeth Status T densitometer (Amazys Holding AG, Regensdorf, Switzerland), as discussed above. The results of the experiments are summarized in FIG. 6 and Table 3 below.

TABLE 3

| | Ink Density | | | |
|---|---|---|---|---|
| Sheet # | Plate 7 | Plate 8 | Plate 9 | Plate 10 |
| 10 | 0.12 | 1.22 | 1.22 | 1.34 |
| 50 | 0.51 | 1.19 | 1.22 | 1.24 |
| 100 | 0.83 | 1.20 | 1.23 | 1.21 |
| 150 | 1.10 | 1.20 | 1.23 | 1.24 |
| 250 | 1.26 | 1.20 | 1.21 | 1.27 |
| 500 | 1.20 | 1.21 | 1.22 | 1.27 |

Figure 6:
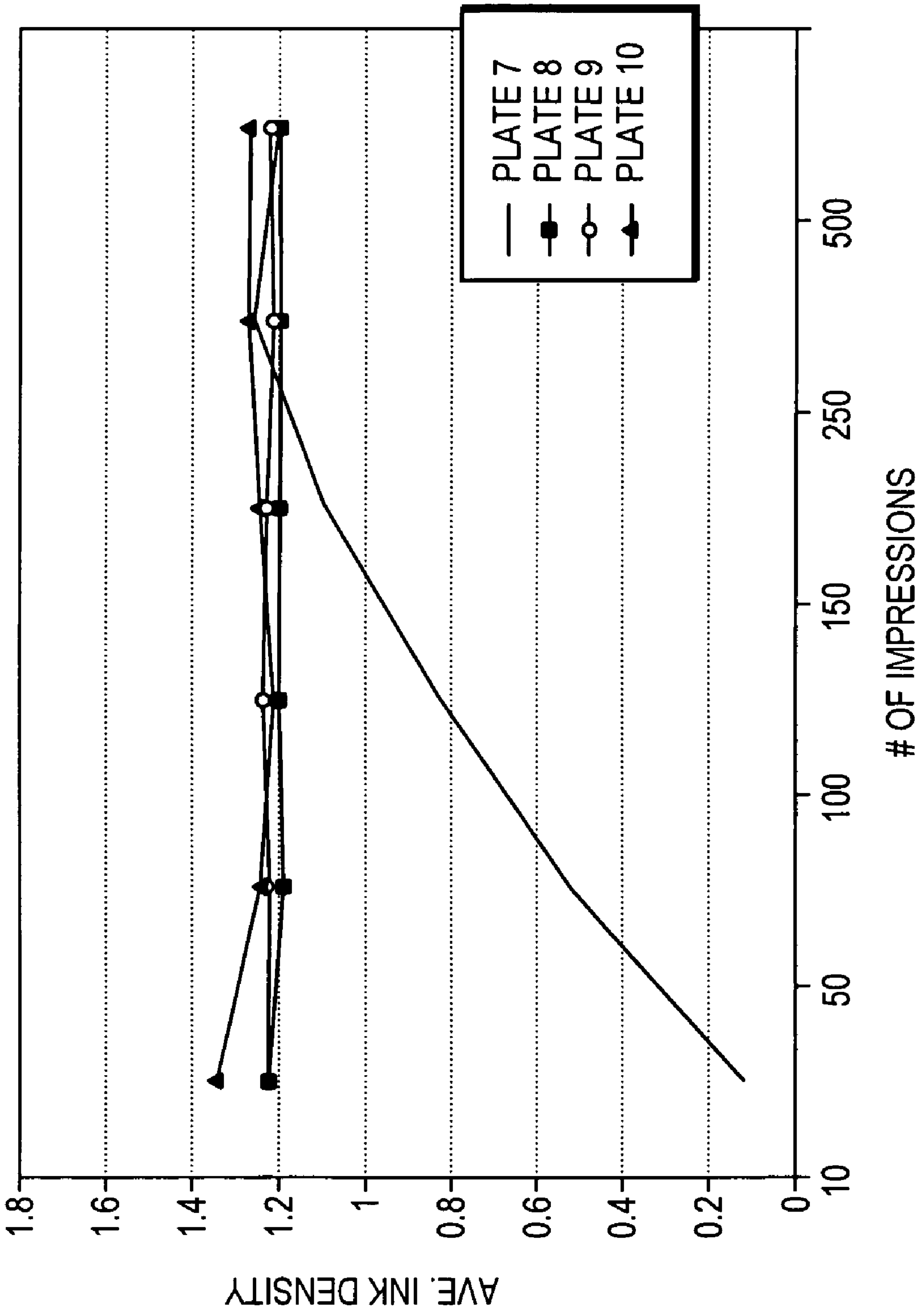

As FIG. 6 and Table 3 indicate, the three primer coated plates (i.e., Plates 8–10) appeared to reach a high average ink density within the first 50 sheets, while the control plate (i.e., Plate 7), which did not contain a primer layer, took longer (i.e., about 250 sheets) to reach an acceptable ink density. The results of these experiments are in accord with those of Example 3, and further illustrate that printing members having primer layers that contain surface-tension modifiers dispersed within a polymeric binder can increase print-making speed and quality.

Example 4

Two lithographic plates corresponding to Plate 7 and Plate 10 in Examples 2 and 3 were produced. Each plate was mounted on a Ryobi 3403DI press (Ryobi Limited, Hiroshima, Japan) and imaged with a ProFire laser diode head (Presstek, Inc., Hudson, N.H.) using 915 nm IR diodes (Lasertel, Tucson, Ariz.). After imaging, a standard two-step cleaning process was performed (dry-rousting followed by wiping with a cloth moistened with a water/glycol mixture). The press was then put into printing mode using Toyo Aqualess black ink (Toyo Ink, Addison, Ill.). Five hundred impressions were made, and the ink density of each sheet was measured using a Macbeth Status T densitometer (Amazys Holding AG, Regensdorf, Switzerland), as discussed above. The results of the experiments are summarized graphically in FIG. 7.

Figure 7:
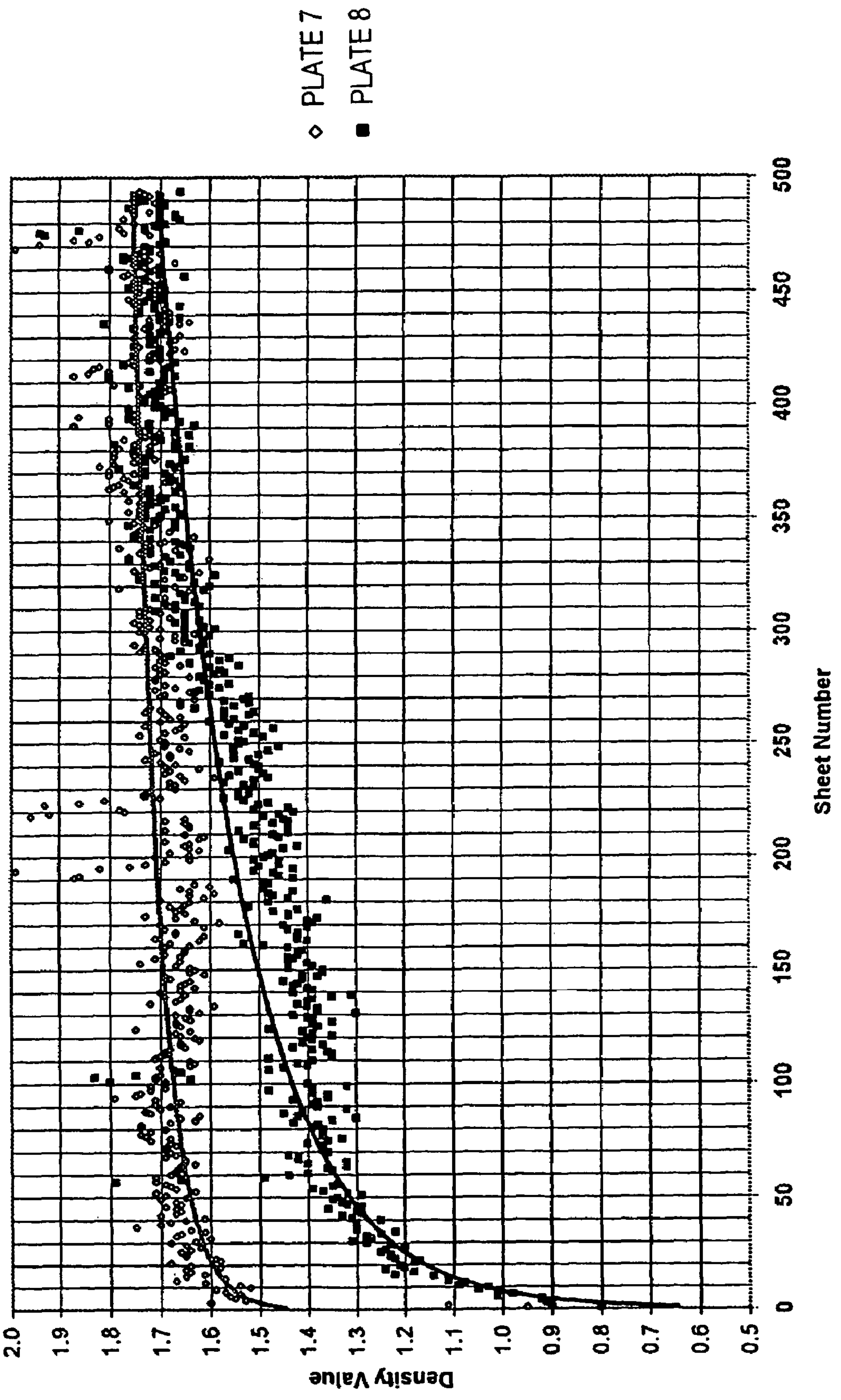

A minimum average ink density of 1.65 was considered an acceptable print quality. As FIG. 7 illustrates, the primer-coated plate (i.e., Plate 10) reached this level in about 15 sheets, while the plate that did not contain a primer layer (i.e., Plate 7) took over 300 sheets to reach an acceptable level. This experiment illustrates that lithographic printing members having primer layers according to the invention can reduce the number of sheets it takes to reach an acceptable print quality, thus reducing the time and cost of printing jobs.

Example 5

To investigate the utility of different polymer binders, dry lithographic plates with primer layers having the same surface-tension modifier (i.e., $TiO_2$) but different polymer binders were prepared. In addition, control plates were prepared having primer layers that lacked the $TiO_2$ surface-tension modifier. The plates were constructed as follows:

| | Substrate | Primer Layer | Imaging Layer | Surface Layer |
|---|---|---|---|---|
| Plate 11 | polyester | 3:1 $TiO_2$/ESTANE (polyurethane polymer, Eastman Chemicals, Kingsport, TN) | titanium | silicone |
| Plate 12 | polyester | ESTANE | titanium | silicone |
| Plate 13 | polyester | 3:1 $TiO_2$/B44 (acrylic polymer, Rohm & Hass, Philadelphia, PA) | titanium | silicone |
| Plate 14 | polyester | B44 | titanium | silicone |
| Plate 15 | polyester | 3:1 $TiO_2$/cellulose acetate propionate (CAP) | titanium | silicone |
| Plate 16 | polyester | CAP | titanium | silicone |

Each of the six plates were imaged and cleaned as described in Example 4. The surface tension value for each plate was determined as in Example 1 above, and the mean roughness value ($R_a$) and mean roughness depth ($R_z$) values were determined using a laser profilometer according to procedures well known in the art. The results are summarized in Table 4 below.

TABLE 4

| Plate | $R_a$ (nm) | $R_z$ (μm) | Surface tension (dyne/cm) |
|---|---|---|---|
| Plate 11 ($TiO_2$/ESTANE) | 716.93 | 7.72 | >60 |
| Plate 12 (ESTANE) | 89.08 | 1.10 | <30 |
| Plate 13 ($TiO_2$/B44) | 387.19 | 7.11 | 56 |
| Plate 14 (B44) | 97.90 | 0.98 | <30 |
| Plate 15 ($TiO_2$/CAP) | 610.79 | 7.26 | >60 |
| Plate 16 (CAP) | 160.44 | 1.67 | <30 |

As Table 4 indicates, a variety of polymer binders can be used to produce primer layers according to the invention. In addition, Table 4 further illustrates the increase in surface roughness and surface tension of primer layers due to the introduction of a $TiO_2$ surface-tension modifier.

Example 6

To investigate the effect that the ratio of surface tension modifer to polymer binder has on surface tension and roughness, three dry lithographic plates with primer layers having different amounts of $TiO_2$ were prepared. In addition, a control plate having a primer layer that lacked a surface-tension modifier was prepared. Finally, a fourth plate having a different surface-tension modifier, barium titanate ($BaTiO_3$) was prepared. The plates were constructed as follows:

| | Substrate | Primer Layer | Imaging Layer | Surface Layer |
|---|---|---|---|---|
| Plate 17 | polyester | 3:1 $TiO_2$/cellulose acetate propionate (CAP) | titanium | silicone |
| Plate 18 | polyester | 2:1 $TiO_2$/CAP | titanium | silicone |
| Plate 19 | polyester | 1.5:1 $TiO_2$/CAP | titanium | silicone |
| Plate 20 | polyester | CAP | titanium | silicone |
| Plate 21 | polyester | 3:1 $BaTiO_3$/CAP | titanium | silicone |

Each of the six plates were imaged and cleaned as described in Example 4. The surface tension value for each plate was determined as in Example 1 above, and the surface roughness values $R_a$ and $R_z$ were determined as described above. The results are summarized in Table 5 below.

TABLE 5

| Plate | $R_a$ (nm) | $R_z$ (μm) | Surface tension (dyne/cm) |
|---|---|---|---|
| Plate 17 (3:1 $TiO_2$/CAP) | 636.11 | 7.72 | 56 |
| Plate 18 (2:1 $TiO_2$/CAP) | 580.34 | 7.18 | 42 |
| Plate 19 (1.5:1 $TiO_2$/CAP) | 450.76 | 5.21 | 32 |
| Plate 20 (CAP) | 207.52 | 2.34 | <30 |
| Plate 21 (3:1 $BaTiO_3$/CAP) | 654.88 | 7.68 | >60 |

As Table 5 indicates, reducing the amount of surface-tension modifier in the primer layer reduces the roughness and surface tension of the imaged plate, which can result in reduced inking performance. Additionally, Table 5 shows that primer layers having the same ratio of two different surface-tension modifiers had similar roughness and surface tension values, which suggests that either surface-tension modifier can be used in a printing member according to the invention.

Example 8

As discussed above, lithographic printing members have the propensity to build up static charge while on-press, which can lead to static discharge. Static discharge can pose significant health and safety hazards to press operators, and can also cause non-image areas to ablate post-imaging, creating additional unwanted ink-receptive areas. The following experiments were designed to illustrate the effect that primer layers according to the invention have on static charge buildup during the print-making process.

As a control, a dry lithographic plate corresponding to Plate 7 of Example 3, which did not contain a primer layer, was constructed. The plate was placed on a Heidelberg GTO printing press (Heidelberg, Germany), and subjected to multiple revolutions of the printing press. Static discharge was observed between 500–1500 revolutions of the press, and the plate retained enough static charge to shock the press operators while dismounting the plate from the press.

To test the effect of the primer layer according to the invention, a dry lithographic plate corresponding to Plate 10 of Example 3, which contained a 3:1 $TiO_2$/cellulose acetate butyrate primer layer, was constructed. The plate was subjected to the same conditions as the control plate. In contrast to the control, no static discharge was observed after 3000–5000 revolutions of the press. Additionally, operators received no shocks during press dismounting.

These experiments illustrate that a printing member containing a $TiO_2$/cellulose acetate butyrate primer layer can reduce static charge buildup during the printmaking process. These printing members are safer to handle and increase the quality of the prints produced.

It will be seen that the foregoing techniques provide a basis for improved lithographic printing and superior plate constructions. The terms and expressions employed herein are used as terms of description and not of limitation, and there is no intention in the use of such terms and expressions of excluding any equivalents of the features shown and described or portions thereof. Instead, it is recognized that various modifications are possible within the scope of the invention claimed.

What is claimed is:

1. A method of imaging a lithographic printing member, the method comprising the steps of:
(a) providing a lithographic printing member comprising a polymeric substrate, a primer layer disposed thereover, an imaging layer disposed over the primer layer, and a surface layer disposed over the imaging layer, wherein
(i) the primer layer comprises a surface-tension modifier dispersed in a polymeric binder and has at least one of
(A) an $R_z$ value being about 7.5 μm to about 8.5 μm and
(B) an $R_a$ value being about 550 nm to about 560 nm, and
(ii) the surface layer and at least one of the primer layer and the substrate have opposite affinities for at least one of ink and a liquid to which ink will not adhere;

(b) exposing the lithographic printing member to imaging radiation in an imagewise pattern, the imaging layer being heated sufficiently to cause separation from and at least partial degradation of the surface layer; and (c) removing at least the surface layer where the lithographic printing member received imaging radiation, thereby creating an imagewise pattern on the lithographic printing member.

2. The method of claim 1, wherein the polymeric binder is selected from the group consisting of: cellulose esters, polyacrylics, polyurethanes, polyvinyl alcohols, polyvinyl esters, polyvinyl acetals, polyvinyl ethers, polyvinyl ketones, polyvinyl carbazoles, and combinations thereof.

3. The method of claim 1, wherein the polymeric binder is selected from the group consisting of cellulose acetate, cellulose acetate propionate, cellulose acetate butyrate, cellulose nitrate, polyvinyl butyral, and combinations thereof.

4. The method of claim 1, wherein the surface-tension modifier is selected from the group consisting of: metal nitride particles, inorganic salt particles, glass particles, and plastic particles.

5. The method of claim 1, wherein the surface-tension modifier comprises metal oxide particles.

6. The method of claim 1, wherein the surface-tension modifier comprises particles selected from the group consisting of $TiO_2$, $SiO_2$, $ZrO_2$, $Al_2O_3$, ZnO, BN, AlN, TiN, ZrN, VN, $BaSO_4$, $CaCO_3$, $BaTiO_3$, $CaSiO_3$, and combinations thereof.

7. The method of claim 1, wherein the surface-tension modifier comprises porous particles.

8. The method of claim 1, wherein the primer layer comprises not less than 50% surface-tension modifier by weight.

9. The method of claim 8, wherein the primer layer comprises not less than 75% surface-tension modifier by weight.

10. The method of claim 1, wherein the primer layer has a surface tension of at least about 45 dyne/cm.

11. The method of claim 10, wherein the primer layer has a surface tension of at least about 55 dyne/cm.

12. The method of claim 11, wherein the primer layer has a surface tension of at least about 65 dyne/cm.

13. The method of claim 1, wherein the primer layer further comprises a dye.

14. The method of claim 1, wherein the polymeric substrate comprises a material selected from the group consisting of polyesters, polycarbonates, polystyrene, polysulfones, cellulose acetate, polyimides, polyamides, and combinations thereof.

15. The method of claim 1, wherein the imaging layer comprises a metal selected from the group consisting of: titanium, aluminum, zinc, chromium, vanadium, zirconium, and alloys thereof.

16. The method of claim 1, wherein the imaging layer comprises a polymer.

17. The method of claim 16, wherein the imaging layer further comprises an IR-absorber dispersed in the polymer.

18. The method of claim 1, wherein the surface layer is oleophobic.

19. The method of claim 18, wherein the surface layer is selected from the group consisting of silicone polymers, fluoropolymers, fluorosilicone polymers, and combinations thereof.

20. The method of claim 1, wherein the surface layer is hydrophilic.

21. The method of claim 20, wherein the surface layer comprises polyvinyl alcohol.

22. The method of claim 1, wherein at least one of the substrate and the primer layer is oleophilic.

23. The method of claim 1, wherein the surface layer and the imaging layer are removed where the lithographic printing member received imaging radiation.

24. The method of claim 1, wherein at least a portion of the imaging layer is ablated by the imaging radiation.

25. A lithographic printing member comprising:

a polymeric substrate;

a primer layer disposed thereover, the primer layer comprising a surface-tension modifier dispersed in a polymeric binder and having at least one of (A) an $R_z$ value of 7.5 μm to about 8.5 μm and (B) an $R_a$ value of 550 nm to about 560 nm;

an imaging layer disposed over the primer layer; and a surface layer disposed over the imaging layer, wherein the surface layer and at least one of the primer layer and the substrate have opposite affinities for at least one of ink and a liquid to which ink will not adhere.

26. The lithographic printing member of claim 25, wherein the polymeric binder is selected from the group consisting of: cellulose esters, polyacrylics, polyurethanes, polyvinyl alcohols, polyvinyl esters, polyvinyl acetals, polyvinyl ethers, polyvinyl ketones, polyvinyl carbazoles, and combinations thereof.

27. The lithographic printing member of claim 25, wherein the polymeric binder is selected from the group consisting of cellulose acetate, cellulose acetate propionate, cellulose acetate butyrate, cellulose nitrate, polyvinyl butyral, and combinations thereof.

28. The lithographic printing member of claim 25, wherein the surface-tension modifier is selected from the group consisting of metal nitride particles, inorganic salt particles, glass particles, and plastic particles.

29. The lithographic printing member of claim 25, wherein the surface-tension modifier comprises metal oxide particles.

30. The lithographic printing member of claim 25, wherein the surface-tension modifier comprises particles selected from the group consisting of $TiO_2$, $SiO_2$, $ZrO_2$, $Al_2O_3$, ZnO, BN, AlN, TiN, ZrN, VN, $BaSO_4$, $CaCO_3$, $BaTiO_3$, $CaSiO_3$, and combinations thereof.

31. The lithographic printing member of claim 25, wherein the surface-tension modifier comprises porous particles.

32. The lithographic printing member of claim 25, wherein the primer layer comprises not less than 50% surface-tension modifier by weight.

33. The lithographic printing member of claim 32, wherein the primer layer comprises not less than 75% surface-tension modifier by weight.

34. The lithographic printing member of claim 25, wherein the primer layer has a surface tension of at least about 45 dyne/cm.

35. The lithographic printing member of claim 34, wherein the primer layer has a surface tension of at least about 55 dyne/cm.

36. The lithographic printing member of claim 35, wherein the primer layer has a surface tension of at least about 65 dyne/cm.

37. The lithographic printing member of claim 25, wherein the primer layer further comprises a dye.

38. The lithographic printing member of claim 25, wherein the polymeric substrate comprises a material selected from the group consisting of polyesters, polycarbonates, polystyrene, polysulfones, cellulose acetate, polyimides, polyamides, and combinations thereof.

39. The lithographic printing member of claim 25, wherein the imaging layer comprises a metal selected from the group consisting of titanium, aluminum, zinc, chromium, vanadium, zirconium, and alloys thereof.

40. The lithographic printing member of claim 25, wherein the imaging layer comprises a polymer.

41. The lithographic printing member of claim 40, wherein the imaging layer further comprises an IR-absorber dispersed in the polymer.

42. The lithographic printing member of claim 25, wherein the surface layer is oleophobic.

43. The lithographic printing member of claim 42, wherein the surface layer is selected from the group consisting of silicone polymers, fluoropolymers, fluorosilicone polymers, and combinations thereof.

44. The lithographic printing member of claim 25, wherein the surface layer is hydrophilic.

45. The lithographic printing member of claim 44, wherein the surface layer comprises polyvinyl alcohol.

46. The lithographic printing member of claim 25, wherein at least one of the substrate and the primer layer is oleophilic.

47. The lithographic printing member of claim 25, wherein the surface layer and the imaging layer are removed where the lithographic printing member received imaging radiation.

48. The lithographic printing member of claim 25, wherein at least a portion of the imaging layer is ablated by the imaging radiation.

* * * * *